United States Patent
Tanoue et al.

(10) Patent No.: US 12,255,063 B2
(45) Date of Patent: Mar. 18, 2025

(54) SUBSTRATE PROCESSING SYSTEM AND SUBSTRATE PROCESSING METHOD

(71) Applicant: Tokyo Electron Limited, Tokyo (JP)

(72) Inventors: Hayato Tanoue, Koshi (JP); Takashi Uno, Koshi (JP); Satoshi Ookawa, Koshi (JP); Suguru Enokida, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 1059 days.

(21) Appl. No.: 17/259,244

(22) PCT Filed: Jul. 18, 2019

(86) PCT No.: PCT/JP2019/028310
§ 371 (c)(1),
(2) Date: Jan. 11, 2021

(87) PCT Pub. No.: WO2020/017599
PCT Pub. Date: Jan. 23, 2020

(65) Prior Publication Data
US 2021/0296119 A1    Sep. 23, 2021

(30) Foreign Application Priority Data
Jul. 19, 2018 (JP) .................. 2018-135424

(51) Int. Cl.
*H01L 21/762* (2006.01)
*H01L 21/02* (2006.01)
(Continued)

(52) U.S. Cl.
CPC .. *H01L 21/02087* (2013.01); *H01L 21/02098* (2013.01); *H01L 21/67092* (2013.01);
(Continued)

(58) Field of Classification Search
CPC ......... H01L 21/76254; H01L 21/76259; H01L 21/02087; H01L 21/02098;
(Continued)

(56) References Cited

U.S. PATENT DOCUMENTS 5,128,281 A * 7/1992 Dyer ................ B24B 9/065
                                                        451/63
7,943,485 B2 * 5/2011 Francis ............ H01L 21/02527
                                                       438/455

(Continued)

FOREIGN PATENT DOCUMENTS

| JP | H9-216152 A | 8/1997 |
| JP | 2004-111606 A | 4/2004 |

(Continued)

OTHER PUBLICATIONS

English Translation of the Written Opinion of the International Searching Authority for PCT/JP2019/016467 dated Oct. 27, 2020 and Written Opinion thereof.

(Continued)

*Primary Examiner* — Eduardo A Rodela
(74) *Attorney, Agent, or Firm* — Shih IP Law Group, PLLC.

(57) ABSTRACT

A substrate processing system configured to process a substrate includes a first modifying apparatus configured to form, in a combined substrate in which a front surface of a first substrate and a front surface of a second substrate are bonded to each other, an internal modification layer elongated within the first substrate in a plane direction from a center of the first substrate toward at least an edge portion of the first substrate as a removing target; a second modifying apparatus configured to form, within the first substrate, an edge modification layer elongated in a thickness direction of the first substrate along a boundary between the edge portion and a central portion of the first substrate; and a separating (Continued)

apparatus configured to separate a portion of the first substrate at a rear surface side, starting from the internal modification layer.

25 Claims, 19 Drawing Sheets

(51) Int. Cl.
  *H01L 21/67* (2006.01)
  *H01L 21/687* (2006.01)
(52) U.S. Cl.
  CPC .. *H01L 21/67115* (2013.01); *H01L 21/68764* (2013.01); *H01L 21/76259* (2013.01)
(58) Field of Classification Search
  CPC ......... H01L 21/67092; H01L 21/67115; H01L 21/68764; B23K 26/26
  See application file for complete search history.

(56) References Cited

U.S. PATENT DOCUMENTS

| | | | | |
|---|---|---|---|---|
| 8,523,636 | B2* | 9/2013 | Uchiyama | B23K 26/0869 |
| | | | | 451/6 |
| 8,530,332 | B2* | 9/2013 | Yamazaki | H01L 21/84 |
| | | | | 438/455 |
| 8,669,166 | B1* | 3/2014 | Agarwal | H01L 21/6836 |
| | | | | 438/459 |
| 9,214,353 | B2* | 12/2015 | Yonehara | B23K 26/53 |
| 10,403,505 | B2* | 9/2019 | Ito | H01L 21/304 |
| 2006/0079155 | A1* | 4/2006 | Nakamura | H01L 21/302 |
| | | | | 451/41 |
| 2011/0212596 | A1* | 9/2011 | Shimomura | H01L 21/02675 |
| | | | | 257/E21.568 |
| 2015/0140785 | A1 | 5/2015 | Kwak et al. | |
| 2017/0025276 | A1 | 1/2017 | Hirata | |
| 2018/0076043 | A1 | 3/2018 | Ito | |

FOREIGN PATENT DOCUMENTS

| | | | | |
|---|---|---|---|---|
| JP | 2005322745 A | | 11/2005 | |
| JP | 2006-108532 A | | 4/2006 | |
| JP | 2008153420 A | | 7/2008 | |
| JP | 2009-131942 A | | 6/2009 | |
| JP | 2009-135342 A | | 6/2009 | |
| JP | 2011-159798 A | | 8/2011 | |
| JP | 2012-064667 A | | 3/2012 | |
| JP | 2012069736 A | * | 4/2012 | ..... H01L 2924/0002 |
| JP | 2013049161 A | | 3/2013 | |
| JP | 2014056910 A | | 3/2014 | |
| JP | 2014-167966 A | | 9/2014 | |
| JP | 2014192233 A | | 10/2014 | |
| JP | 2015-516672 A | | 6/2015 | |
| JP | 2017-024039 A | | 2/2017 | |
| JP | 2017-071074 A | | 4/2017 | |
| JP | 2017-191825 A | | 10/2017 | |
| JP | 2018-043340 A | | 3/2018 | |
| WO | 2013/126927 A2 | | 8/2013 | |

OTHER PUBLICATIONS

International Search Report of PCT/JP2019/028310 dated Oct. 8, 2019.

* cited by examiner

SUBSTRATE PROCESSING SYSTEM AND SUBSTRATE PROCESSING METHOD

CROSS-REFERENCE TO RELATED APPLICATIONS

This Application is a U.S. national phase application under 35 U.S.C. § 371 of PCT Application No. PCT/JP2019/028310 filed on Jul. 18, 2019, which claims the benefit of Japanese Patent Application No. 2018-135424 filed on Jul. 19, 2018, the entire disclosures of which are incorporated herein by reference.

TECHNICAL FIELD

The various aspects and embodiments described herein pertain generally to a substrate processing system and a substrate processing method.

BACKGROUND

Patent Document 1 describes a manufacturing method for a multilayer semiconductor device. In this manufacturing method, the multilayer semiconductor device is manufactured by stacking two or more semiconductor wafers. At this time, a rear surface of each semiconductor wafer is ground to have a required thickness after it is stacked on another semiconductor wafer.

PRIOR ART DOCUMENT

Patent Document 1: Japanese Patent Laid-open Publication No. 2012-069736

DISCLOSURE OF THE INVENTION

Means for Solving the Problems

In an exemplary embodiment, a substrate processing system configured to process a substrate includes a first modifying apparatus configured to form, in a combined substrate in which a front surface of a first substrate and a front surface of a second substrate are bonded to each other, an internal modification layer elongated within the first substrate in a plane direction from a center of the first substrate toward at least an edge portion of the first substrate as a removing target; a second modifying apparatus configured to form, within the first substrate, an edge modification layer elongated in a thickness direction of the first substrate along a boundary between the edge portion and a central portion of the first substrate; and a separating apparatus configured to separate a portion of the first substrate at a rear surface side, starting from the internal modification layer.

DETAILED DESCRIPTION

Figure 1:
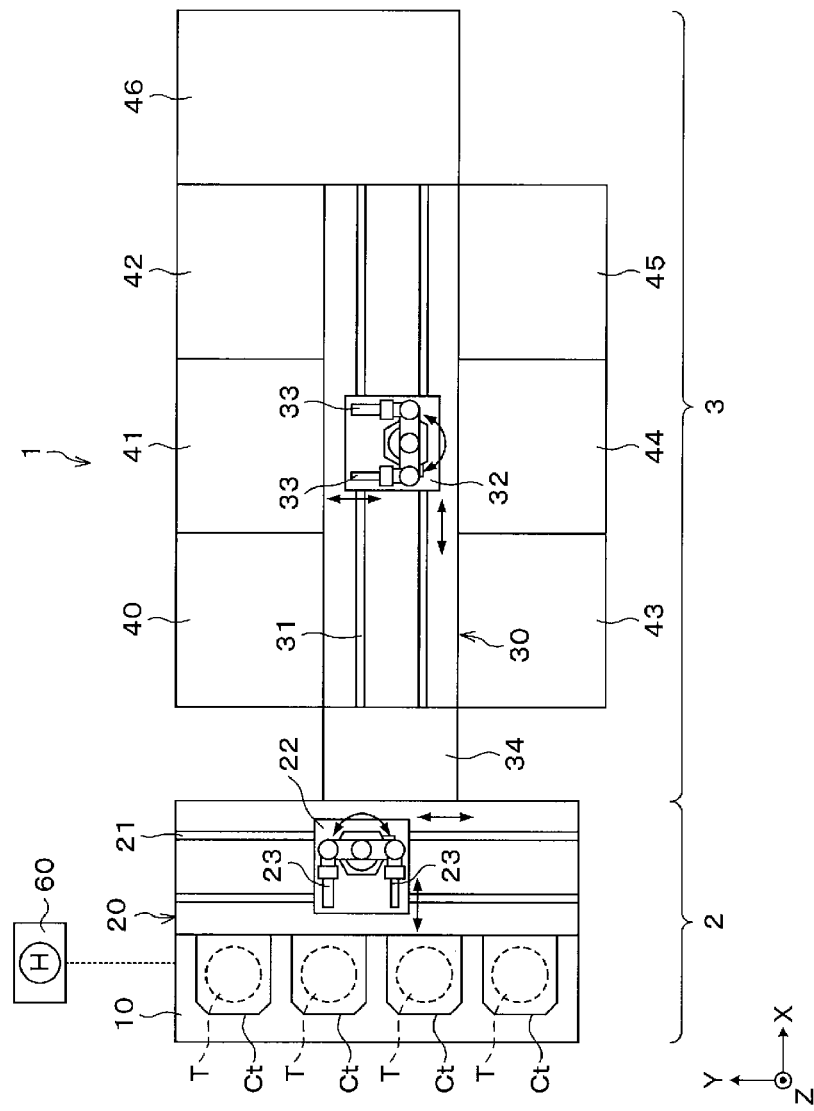
FIG. 1 is a plan view schematically illustrating a configuration of a wafer processing system according to an exemplary embodiment.

In a manufacturing process for a semiconductor device, as a method disclosed in Patent document 1, a semiconductor wafer (hereinafter, simply referred to as "wafer") having devices such as a plurality of electronic circuits formed on a front surface thereof is thinned by grinding a rear surface of the wafer.

The grinding of the rear surface of the wafer is performed by rotating the wafer and a grinding whetstone and lowering the grinding whetstone in a state that the grinding whetstone is in contact with the rear surface of the wafer, for example. In this case, since the grinding whetstone is abraded, it needs to be replaced regularly. Further, since grinding water is used in the grinding processing, disposal of a waste liquid is also required. As a result, a running cost is increased. In this regard, there is still a room for improvement in the conventional wafer thinning processing.

Typically, an edge portion of the wafer is chamfered. If, however, the grinding processing is performed on the rear surface of the wafer as stated above, the edge portion of the wafer is given a sharp pointed shape (a so-called knife edge shape). If so, chipping takes place at the edge portion of the wafer, and the wafer may be damaged. Thus, there is performed a so-called edge trimming of removing the edge portion of the wafer prior to the grinding processing. In the method described in Patent Document 1, for example, this edge trimming is performed by partially grinding or cutting the edge portion of the wafer.

The present disclosure provides a technique capable of thinning the wafer efficiently. Hereinafter, a wafer processing system as a substrate processing system and a wafer processing method as a substrate processing method according to an exemplary embodiment will be described with reference to the accompanying drawings. Further, in the specification and the drawings, parts having substantially same functions and configurations will be assigned same reference numerals, and redundant description will be omitted.

First, a configuration of the wafer processing system according to the present exemplary embodiment will be explained. FIG. 1 is a plan view illustrating a schematic configuration of a wafer processing system 1.

Figure 2:
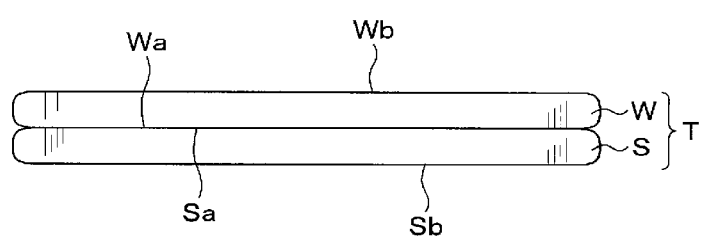
FIG. 2 is a side view illustrating a schematic structure of a combined wafer.
Figure 3:
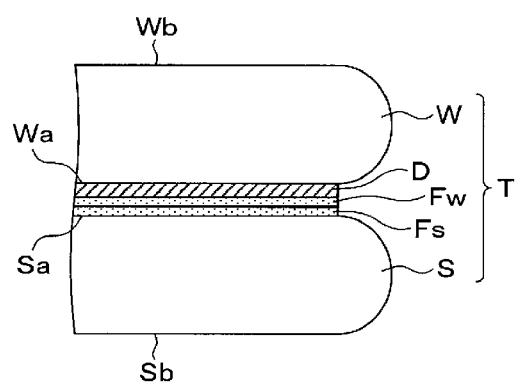
FIG. 3 is a side view illustrating a schematic structure of a part of the combined wafer.

In the wafer processing system 1, by performing required processings on a combined wafer T as a combined substrate in which a processing target wafer W as a first substrate and a support wafer S as a second substrate are bonded to each other, the processing target wafer W is thinned, as shown in FIG. 2 and FIG. 3. Hereinafter, in the processing target wafer W, a surface bonded to the support wafer S will be referred to as a front surface Wa, and a surface opposite to the front surface Wa will be referred to as a rear surface Wb. Likewise, in the support wafer S, a surface bonded to the processing target wafer W will be referred to as a front surface Sa, and a surface opposite to the front surface Sa will be referred to as a rear surface Sb.

The processing target wafer W is a semiconductor wafer such as, but not limited to, a silicon wafer, and has, on the front surface Wa thereof, a device layer D including a plurality of devices. Further, an oxide film Fw, for example, a $SiO_2$ film (TEOS film) is formed on the device layer D. Furthermore, an edge portion of the processing target wafer W is chamfered, and a thickness of the edge portion decreases toward a leading end thereof on a cross section thereof.

The support wafer S is a wafer which supports the processing target wafer W. An oxide film Fs, for example, $SiO_2$ film (TEOS film) is formed on the front surface Sa of the support wafer S. The support wafer S serves as a protection member which protects the devices formed on the front surface Wa of the processing target wafer W. Further, if the support wafer S has a plurality of devices formed on the front surface Sa thereof, a device layer (not shown) is formed on the front surface Sa, the same as in the processing target wafer W.

In FIG. 2, illustration of the device layer D and the oxide films Fw and Fs is omitted for the simplicity of illustration. Further, in other drawings to be used in the following description as well, illustration of the device layer D and the oxide films Fw and Fs may sometimes be omitted.

As depicted in FIG. 1, the wafer processing system 1 includes a carry-in/out station 2 and a processing station 3 connected as one body. In the carry-in/out station 2, a cassette Ct capable of accommodating therein a multiple number of combined wafers T is carried to/from the outside, for example. The processing station 3 is equipped with various kinds of processing apparatuses configured to perform required processings on the combined wafers T.

The carry-in/out station 2 is equipped with a cassette placing table 10. In the shown example, a plurality of, for example, four cassettes Ct can be arranged on the cassette placing table 10 in a row in the Y-axis direction. Further, the number of the cassettes Ct placed on the cassette placing table 10 is not limited to the example of the present exemplary embodiment but can be selected as required.

In the carry-in/out station 2, a wafer transfer section 20 is provided adjacent to the cassette placing table 10. Provided in the wafer transfer section 20 is a wafer transfer device 22 configured to be movable on a transfer path 21 which is elongated in the Y-axis direction. The wafer transfer device 22 is equipped with, for example, two transfer arms 23 each configured to hold and transfer the combined wafer T. Each transfer arm 23 is configured to be movable in a horizontal direction and a vertical direction and pivotable around a horizontal axis and a vertical axis. Further, the configuration of the transfer arm 23 is not limited to the exemplary embodiment, and various other configurations may be adopted.

A wafer transfer section 30 is provided in the processing station 3. Provided in the wafer transfer section 30 is a wafer transfer device 32 configured to be movable on a transfer path 31 which is elongated in the X-axis direction. The wafer transfer device 32 is configured to be capable of transferring the combined wafer T to/from a transition device 34, a modifying apparatus 40, an edge removing apparatus 41, a wet etching apparatus 42, a protective film forming apparatus 43, a separating apparatus 44, a protective film removing apparatus 45 and a grinding apparatus 46 to be described later. Further, the wafer transfer device 32 is equipped with, for example, two transfer arms 33 each configured to hold and transfer the combined wafer T. Each transfer arm 33 is configured to be movable in the horizontal direction and the vertical direction and pivotable around a horizontal axis and a vertical axis. Further, the configuration of the transfer arm 33 is not limited to the present exemplary embodiment, and various other configurations may be adopted.

The transition device 34 is provided between the wafer transfer section 20 and the wafer transfer section 30 to deliver the combined wafer T.

The modifying apparatus 40, the edge removing apparatus 41 and the wet etching apparatus 42 are arranged at a positive Y-axis side of the wafer transfer section 30 in this sequence in the X-axis direction from the carry-in/out station 2. The protective film forming apparatus 43, the separating apparatus 44 and the protective film removing apparatus 45 are arranged at a negative Y-axis side of the wafer transfer section 30 in this sequence in the X-axis direction form the carry-in/out station 2. The grinding apparatus 46 is provided at a positive X-axis side of the wafer transfer section 30. Further, in the present exemplary embodiment, the wet etching apparatus 42 and the grinding apparatus 46 constitutes a damage processing apparatus. The protective film forming apparatus 43 constitutes a protective layer forming apparatus, and the protective film removing apparatus 45 constitutes a protective layer removing apparatus.

Figure 4:
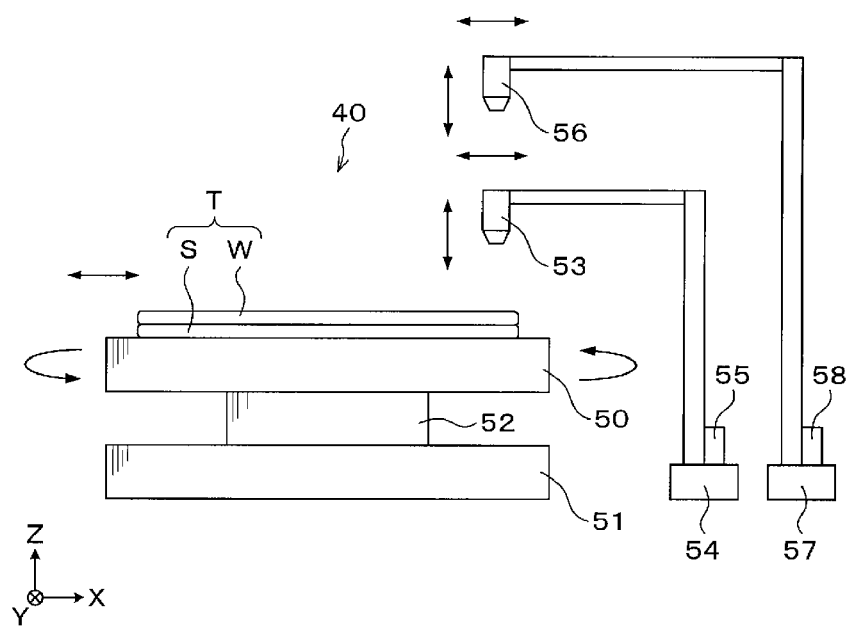
FIG. 4 is a side view illustrating a schematic configuration of a modifying apparatus.

The modifying apparatus 40 forms an internal modification layer, an edge modification layer and a split modification layer to be described later by radiating laser light to an inside of the processing target wafer W. The modifying apparatus 40 is equipped with a chuck 50 configured to hold the combined wafer T in a state that the processing target wafer W is placed at an upper side and the support wafer S is placed at a lower side, as shown in FIG. 4. The chuck 50 is configured to be movable in the X-axis direction and the Y-axis direction by a moving mechanism 51. The moving mechanism 51 is implemented by a general precise XY-stage. Further, the chuck 50 is also configured to be pivotable around a vertical axis by a rotating mechanism 52. Furthermore, the modifying apparatus 40 according to the present exemplary embodiment forms the internal modification layer, the edge modification layer and the split modification layer, and serves as both a first modifying apparatus and a second modifying apparatus of the present disclosure. Here, however, the internal modification layer may be formed by the first modifying apparatus, and the edge modification layer and the split modification layer may be formed by the second modifying apparatus which is different from the first modifying apparatus.

A laser head 53 configured to radiate the laser light to the inside of the processing target wafer W is provided above the chuck 50. The laser head 53 concentrates and radiates the laser light (for example, YAG laser) having a wavelength featuring transmissivity for the processing target wafer W to a preset position within the processing target wafer W as laser light in a high-frequency pulse shape emitted from a laser light oscillator (not shown). Accordingly, a portion within the processing target wafer W to which the laser light L is concentrated is modified, so that a modification layer is formed. The laser head 53 may be configured to be movable in the X-axis direction and the Y-axis direction by a moving mechanism 54. The moving mechanism 54 is implemented by a general precise XY-stage. Further, the laser head 53 may be configured to be movable in the Z-axis direction by an elevating mechanism 55.

Further, in the modifying apparatus 40, by radiating laser light L to an interface of the processing target wafer W, a non-bonding region is formed at an edge portion which is a target portion to be removed in edge trimming. By way of example, by allowing the laser light L to be transmitted to the front surface Wa of the processing target wafer W as the bonding surface, ablation is induced at each interface. Accordingly, a bonding force between the processing target wafer W and the support wafer S is reduced at the interfaces corresponding to the edge portion to be removed, as will be described later, so that the non-bonding region is formed, and the edge portion is thus efficiently removed. In this case, a second laser head 56 configured to form the non-bonding region is provided above the chuck 50. The second laser head 56 concentrates and radiates the laser light (for example, $CO_2$ laser) having a wavelength featuring transmissivity for the processing target wafer W to a preset position of the interface of the processing target wafer W as laser light in a high-frequency pulse shape emitted from a laser light oscillator (not shown). Accordingly, a portion of the interface of the processing target wafer W to which the laser light is concentrated is modified (roughened and removed). The second laser head 56 may be configured to be movable in the X-axis direction and the Y-axis direction by a moving mechanism 57. The moving mechanism 57 is implemented by a general precise XY-stage. Further, the second laser head 56 may be configured to be movable in the Z-axis direction by an elevating mechanism 58.

Here, it is assumed that the interface of the processing target wafer W according to the present exemplary embodiment includes an inside of the processing target wafer W, an inside of the device layer D, an inside of the oxide film Fw, and so forth. That is, the non-bonding region can be formed at any position near the interface of the processing target wafer W as long as the bonding force between the processing target wafer W and the support wafer S at the edge portion of the processing target wafer W can be appropriately reduced.

The edge removing apparatus 41 shown in FIG. 1 is configured to remove the edge portion of the processing target wafer W, starting from the edge modification layer formed by the modifying apparatus 40.

The wet etching apparatus 42 is configured to supply a chemical liquid (etching liquid) onto the rear surface Wb of the processing target wafer W. Then, the wet etching apparatus 42 etches the rear surface Wb ground by the grinding apparatus 46. Further, the rear surface Wb may have a grinding trace formed thereon, and this rear surface Wb constitutes a damaged surface. By way of example, HF, $HNO_3$, $H_3PO_4$, TMAH, choline, KOH, or the like may be used as the chemical liquid.

The protective film forming apparatus 43 is configured to form a protective film to protect a sidewall portion of the device layer D exposed as a result of removing the edge portion of the processing target wafer W in the edge removing apparatus 41. Further, in the present exemplary embodiment, the protective film forming apparatus 43 forms the protective film by supplying a protective material in a gas state, as will be described later, and the protective film is formed on the rear surface of the processing target wafer W as well as on the sidewall portion of the device layer D. The formed protective film may be heated through a heat treatment.

The separating apparatus 44 is configured to separate a portion of the processing target wafer W at the rear surface Wb side, starting from the internal modification layer formed by the modifying apparatus 40.

The protective film removing apparatus 45 is configured to remove the protective film formed by the protective film forming apparatus 43. To elaborate, the protective film removing apparatus 45 removes the protective film by supplying, for example, an organic solvent to the protective film.

The grinding apparatus 46 is configured to grind the rear surface Wb of the processing target wafer W. Further, the grinding apparatus 46 removes, in the rear surface Wb in which the internal modification layer is formed, the corresponding internal modification layer, and also removes the edge modification layer.

To elaborate, in the grinding apparatus 46, the processing target wafer W (combined wafer T) and a grinding whetstone are rotated and the grinding whetstone is lowered in the state that the grinding whetstone is in contact with the rear surface Wb. Further, the aforementioned internal modification layer and the edge modification layer are damaged layers, and the rear surface Wb constitutes the damaged surface.

The above-described wafer processing system 1 is equipped with a control device 60. The control device 60 is, for example, a computer, and includes a program storage (not shown). A program for controlling a processing of the combined wafer T in the wafer processing system 1 is stored in the program storage. Further, the program storage also stores therein a program for implementing a substrate processing to be described later in the wafer processing system 1 by controlling the above-described various processing apparatuses and a driving system such as the transfer devices. Further, the programs may be recorded in a computer-readable recording medium H, and may be installed from this recording medium H to the control device 60.

Figure 5:
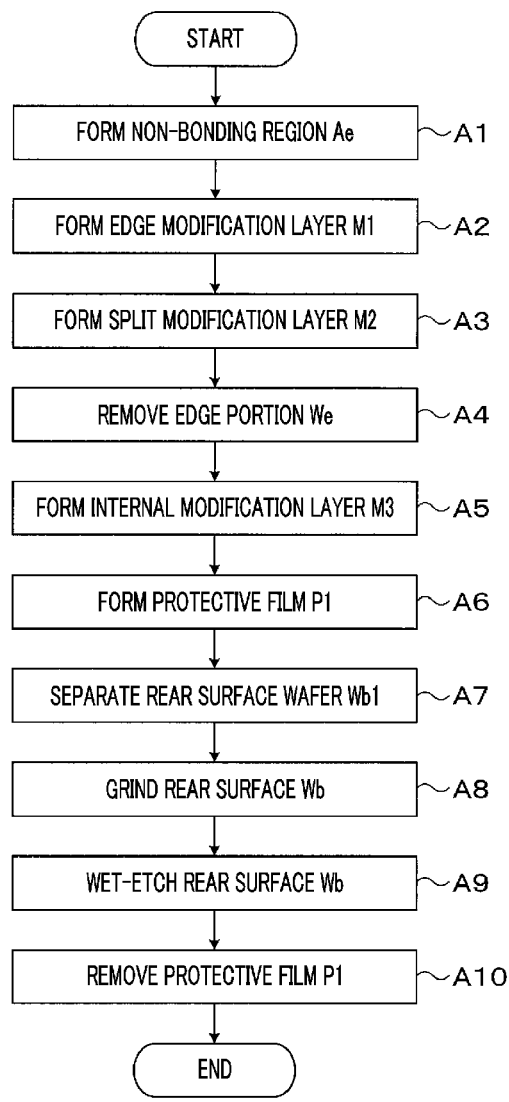
FIG. 5 is a flowchart illustrating major processes of a wafer processing according to a first exemplary embodiment.

Now, a wafer processing according to a first exemplary embodiment, which is performed by using the wafer processing system 1 having the above-described configuration, will be explained. FIG. 5 is a flowchart illustrating major processes of the wafer processing. In the present exemplary embodiment, the combined wafer T is previously formed by bonding the processing target wafer W and the support wafer S with Van der Waals force and a hydrogen bond (intermolecular force) in a bonding apparatus (not shown) which is provided at an outside of the wafer processing system 1.

Figure 6A:
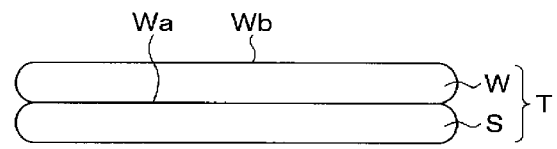
FIG. 6A to FIG. 6H are explanatory diagrams for describing the major processes of the wafer processing according to the first exemplary embodiment.

First, a cassette Ct having therein a multiple number of combined wafers T is placed on the cassette placing table 10 of the carry-in/out station 2, as shown in FIG. 6A.

Figure 6B:
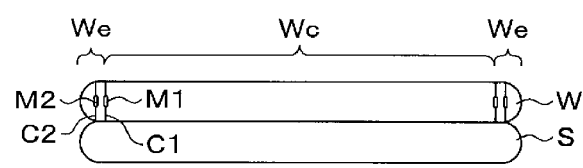
Figure 7:
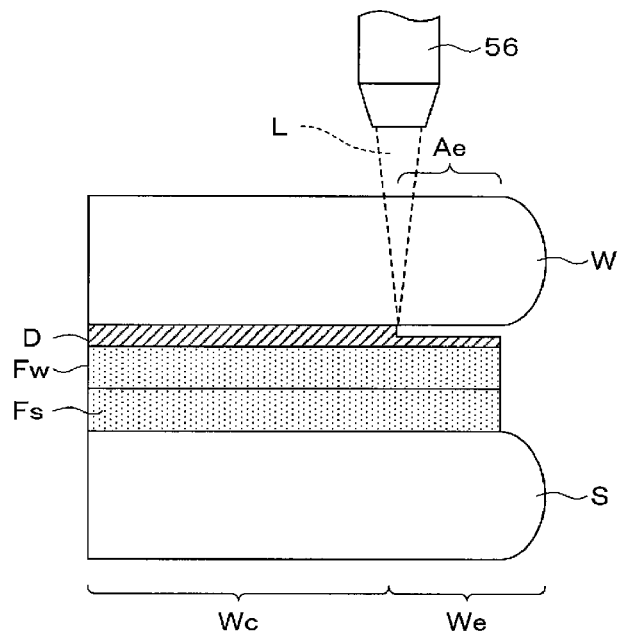
FIG. 7 is an explanatory diagram illustrating a state in which a non-bonding region is formed in the modifying apparatus.

Then, the combined wafer T is taken out of the cassette Ct by the wafer transfer device 22, and transferred into the transition device 34. Subsequently, the combined wafer T is taken out of the transition device 34 by the wafer transfer device 32, and transferred into the modifying apparatus 40. In the modifying apparatus 40, a non-bonding region Ae is first formed at an interface between the processing target wafer W and a device layer D at a portion corresponding to an edge portion We, as shown in FIG. 7 (process A1 of FIG. 5). Subsequently, as shown in FIG. 6B, an edge modification layer M1 is formed within the processing target wafer W (process A2 of FIG. 5), and a split modification layer M2 is formed within the processing target wafer W (process A3 of FIG. 5).

In the modifying apparatus 40, the combined wafer T is delivered onto the chuck 50 and held thereon. Then, as depicted in FIG. 7, the second laser head 56 is moved to a position above the edge portion We of the processing target wafer W. Thereafter, by radiating the laser light L from the second laser head 56 while rotating the chuck 50 by the rotating mechanism 52, the non-bonding region Ae is formed at the interface between the processing target wafer W and the device layer D at the portion corresponding to the edge portion We (process A1 of FIG. 5).

Figure 8:
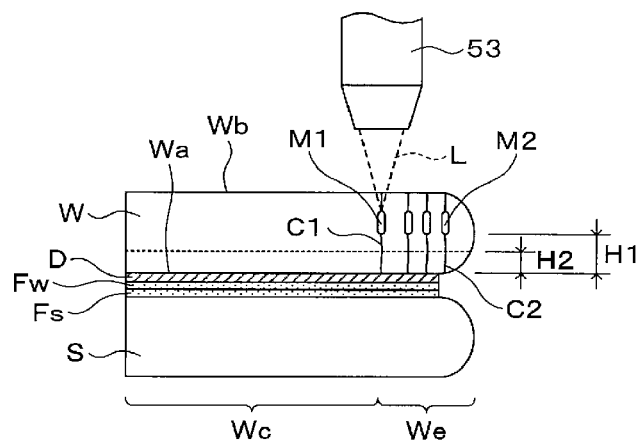
FIG. 8 is a longitudinal cross sectional view illustrating formation of an edge modification layer and a split modification layer in a processing target wafer in the modifying apparatus.

Then, in the same modifying apparatus 40, the laser head 53 is moved to a position above a boundary between the edge portion We and a central portion Wc of the processing target wafer W, as shown in FIG. 8. Thereafter, by radiating the laser light L from the laser head 53 to an inside of the processing target wafer W while rotating the chuck 50 by the rotating mechanism 52, the edge modification layer M1 is formed within the processing target wafer W (process A2 of FIG. 5).

Figure 9:
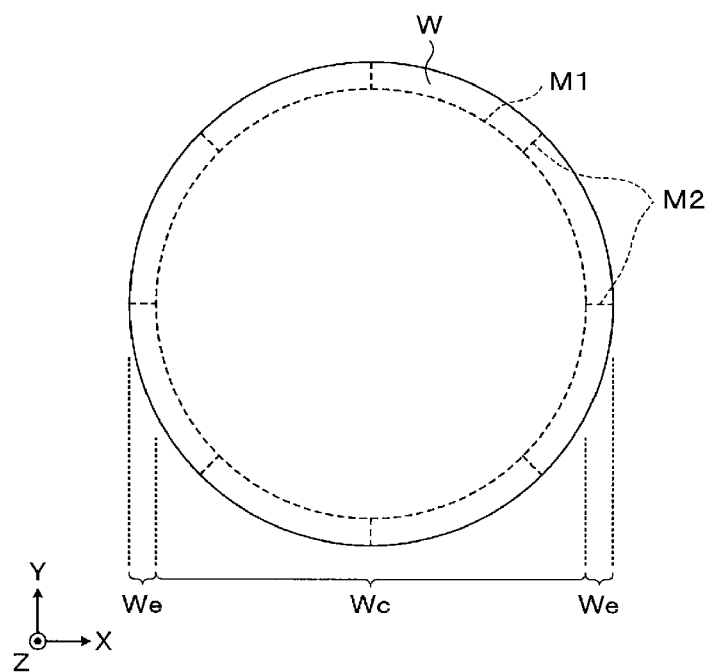
FIG. 9 is a plan view illustrating the formation of the edge modification layer and the split modification layer in the processing target wafer in the modifying apparatus.

The edge modification layer M1 serves as a starting point when removing the edge portion We in the edge trimming, and is formed to have an annular shape along the boundary between the edge portion We to be removed and the central portion Wc of the processing target wafer W, as illustrated in FIG. 8 and FIG. 9. The edge portion We is in a range from, e.g., 1 mm to 5 mm from an outer edge of the processing target wafer W in a diametrical direction, and includes a chamfered portion.

Further, the edge modification layer M1 is elongated in a thickness direction and has an aspect ratio with a vertically longer side. A lower end of the edge modification layer M1 is located above a target surface (indicated by a dashed line in FIG. 8) of the processing target wafer W after being ground. That is, a distance H1 between the lower end of the edge modification layer M1 and the front surface Wa of the processing target wafer W is larger than a target thickness H2 of the processing target wafer W after being ground. In this case, the edge modification layer M1 does not remain in the processing target wafer W after being ground.

Further, within the processing target wafer W, a crack C1 may develop from the edge modification layer M1 and reaches the front surface Wa and the rear surface Wb of the processing target wafer W. Further, multiple modification layers M1 may be formed in the thickness direction.

Subsequently, by moving the laser head 53 in the same modifying apparatus 40, the split modification layer M2 is formed within the processing target wafer W to be located at an outside of the edge modification layer M1 in the diametrical direction, as depicted in FIG. 8 (process A3 of FIG. 5). Like the edge modification layer M1, this split modification layer M2 is elongated in the thickness direction, and has an aspect ratio with a vertically longer side. Further, a crack C2 develops from the split modification layer M2 and reaches the front surface Wa and the rear surface Wb. Further, multiple split modification layers M2 may be formed in the thickness direction.

By forming the multiple split modification layers M2 and multiple cracks C2 at a pitch of several micrometers in the diametrical direction, a single-line split modification layer M2 elongated outwards from the edge modification layer M1 in the diametrical direction is formed, as shown in FIG. 9. Further, in the shown example, this single-line split modification layer M2 elongated in the diametrical direction is formed at eight different positions. However, the number of the split modification layers M2 is not particularly limited. As long as the split modification layers M2 are formed at two positions at least, the edge portion We can be removed. In this case, when removing the edge portion We in the edge trimming, the corresponding edge portion We is separated starting from the annular edge modification layer M1 to be divided by the split modification layers M2 into multiple pieces. As a result, the edge portion We to be removed is broken into smaller pieces, and, thus, it can be removed more easily.

Figure 6C:
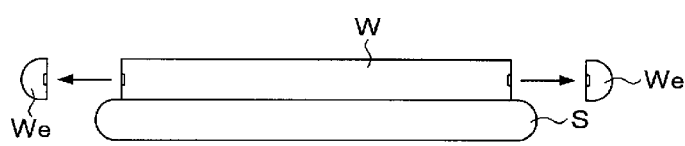

Afterwards, the combined wafer T is transferred into the edge removing apparatus 41 by the wafer transfer device 32. In the edge removing apparatus 41, the edge portion We of the processing target wafer W is removed, starting from the edge modification layer M1, as shown in FIG. 6C (process A4 of FIG. 5).

Figure 10A:
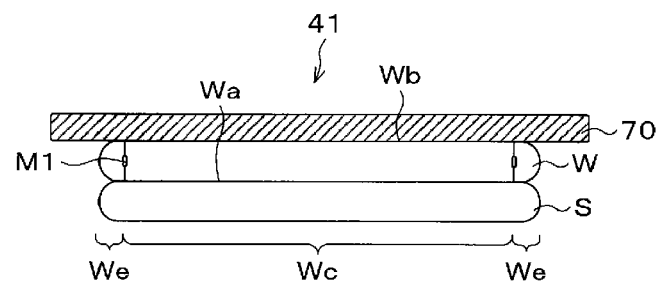
FIG. 10A to FIG. 10C are explanatory diagrams illustrating removal of an edge portion of the processing target wafer in an edge removing apparatus.
Figure 10B:
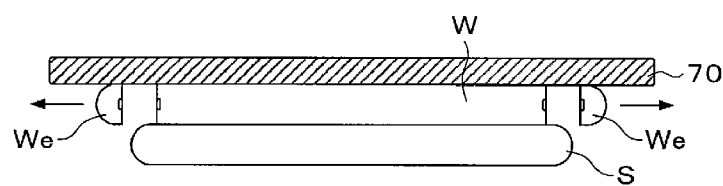
Figure 10C:
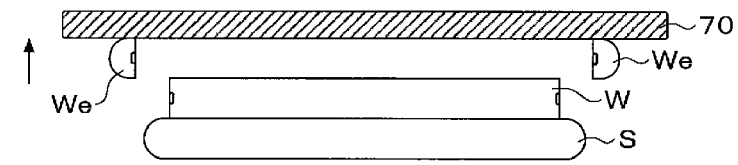

In the edge removing apparatus 41, the edge portion We is removed by, for example, enlarging (expanding) a tape 70, as shown in FIG. 10A to FIG. 10C. First, as shown in FIG. 10A, the tape 70, which is expandable, is attached to the rear surface Wb of the processing target wafer W. Then, as depicted in FIG. 10B, by expanding the tape 70 in the diametrical direction of the processing target wafer W, the edge portion We is separated from the processing target wafer W, starting from the edge modification layer M1. At this time, the edge portion We is separated while being broken into smaller pieces, starting from the split modification layers M2. Thereafter, by raising the tape 70 away from the processing target wafer W, as shown in FIG. 10C, the edge portion We is removed. At this time, a processing of reducing an adhesion of the tape 70, for example, an ultraviolet irradiation processing may be performed to separate the tape 70 easily.

In the removing of the edge portion We, since the non-bonding region Ae is formed at the interface between the processing target wafer W and the support wafer S at the portion corresponding to the edge portion We, the edge portion We can be removed appropriately.

Further, the way how to remove the edge portion We is not limited to the present exemplary embodiment. By way of example, the edge portion We may be removed by being pressed by an air blow or a water jet. Alternatively, the edge portion We may be removed physically by bringing a jig such as pincette into contact with the edge portion We.

Figure 6D:
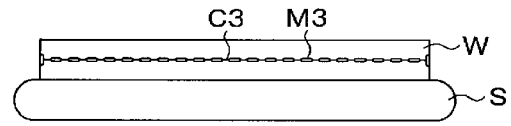

Subsequently, the combined wafer T is transferred into the modifying apparatus 40 again by the wafer transfer device 32. In the modifying apparatus 40, an internal modification layer M3 is formed within the processing target wafer W, as depicted in FIG. 6D (process A5 of FIG. 5).

Figure 11:
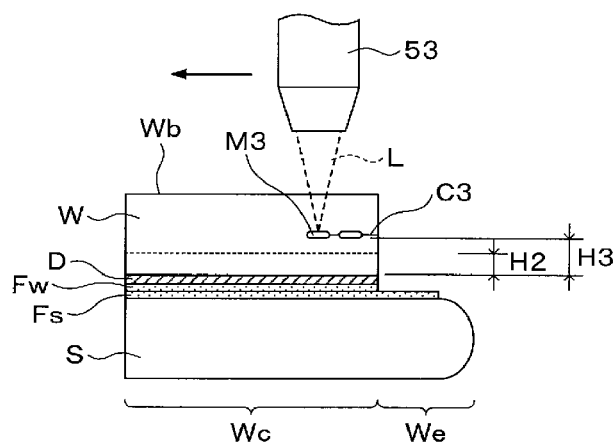
FIG. 11 is a longitudinal cross sectional view illustrating formation of an internal modification layer in the processing target wafer in the modifying apparatus.

To elaborate, by radiating the laser light L to the inside of the processing target wafer W from the laser head 53 as shown in FIG. 11, the internal modification layer M3 is formed. The internal modification layer M3 is elongated in a plane direction and has an aspect ratio with a horizontally longer side. A lower end of the internal modification layer M3 is located slightly above the target surface (indicated by a dashed line in FIG. 11) of the processing target wafer W after being ground. That is, a distance H3 between the lower end of the internal modification layer M3 and the front surface Wa of the processing target wafer W is slightly larger than the target thickness H2 of the processing target wafer W after being ground. Further, the internal modification layer M3 may have an aspect ratio with a horizontally longer side, and a multiple number of such internal modification layers M3 may be arranged at a small pitch therebetween. Further, a crack C3 develops from the internal modification layer M3 in the plane direction. When the pitch of the internal modification layers M3 is small, no crack C3 may be formed.

Figure 12:
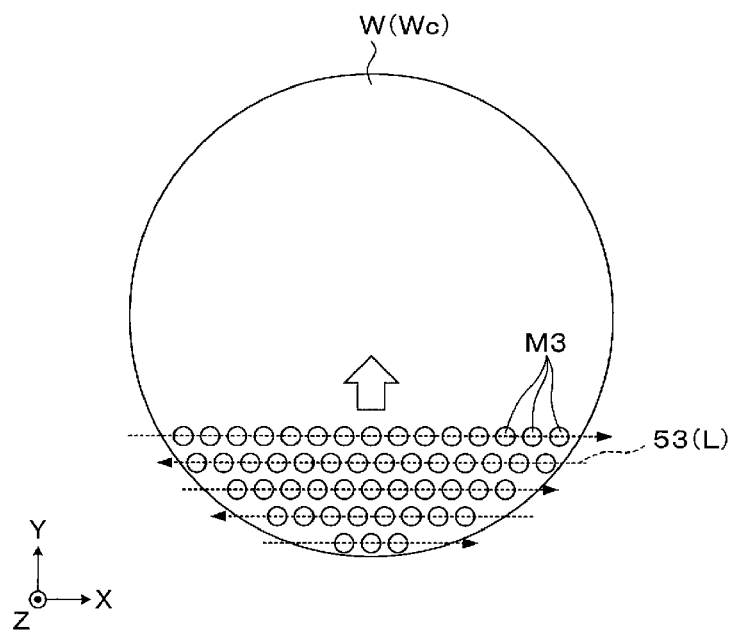
FIG. 12 is a plan view illustrating the formation of the internal modification layer in the processing target wafer in the modifying apparatus.

By moving the laser head 53 and the combined wafer T relatively in the horizontal direction, the multiple number of internal modification layers M3 are formed within the central portion Wc of the processing target wafer W, as depicted in FIG. 11 and FIG. 12. To be specific, by moving the laser head 53 in the X-axis direction, a single row of the internal modification layers M3 is formed. Then, by moving the laser head 53 in the X-axis direction after the laser head 53 is moved in the Y-axis direction, another row of the internal modification layers M3 is formed. These internal modification layers M3 are formed at the same height. Accordingly, the internal modification layers M3 are formed within the entire surface of the central portion Wc.

Figure 13:
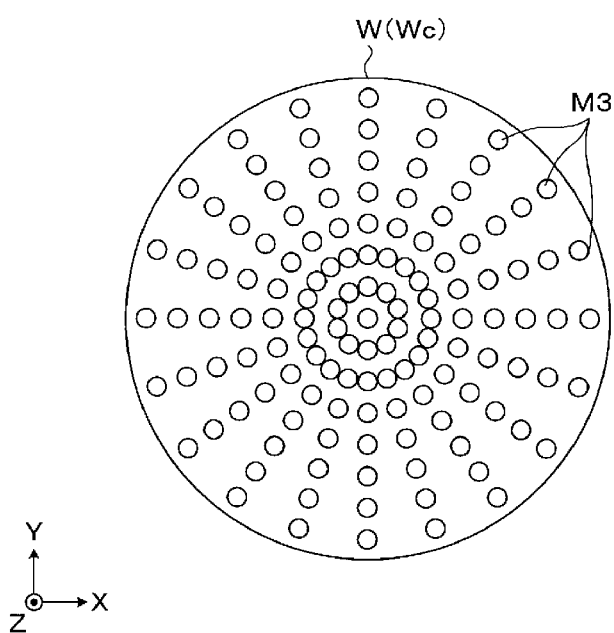
FIG. 13 is a plan view illustrating the formation of the internal modification layer in the processing target wafer in the modifying apparatus.

Further, in the modifying apparatus 40, the laser head 53 may be moved in the horizontal direction while rotating the chuck 50. In this case, the internal modification layers M3 are formed in a spiral shape, when viewed from the top. Further, as shown in FIG. 13, for example, the pitch of the internal modification layers M3 may be differed concentrically in the diametrical direction of the processing target wafer W. In the example of FIG. 13, the multiple number of internal modification layers M3 are formed symmetrically with respect to a center of the processing target wafer W.

Figure 6E:
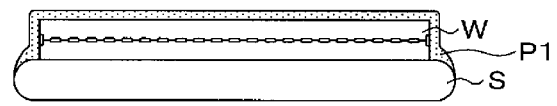

Thereafter, the combined wafer T is transferred into the protective film forming apparatus 43 by the wafer transfer device 32. In the protective film forming apparatus 43, a protective film P1 is formed on the processing target wafer W, as illustrated in FIG. 6E (process A6 of FIG. 5).

Figure 14:
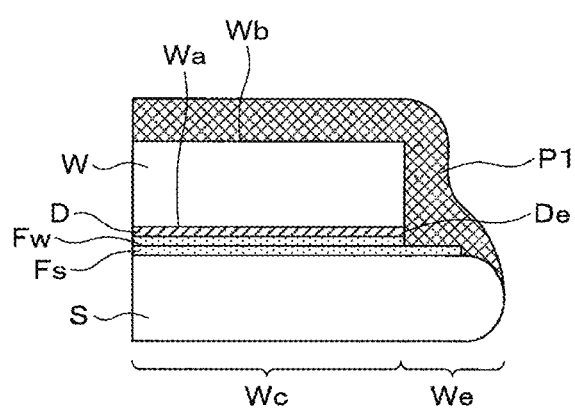
FIG. 14 is an explanatory diagram illustrating a state in which a protective film is formed in a protective film forming apparatus.

In the processing target wafer W from which the edge portion We is removed in the process A4, a sidewall portion De of the device layer D is exposed, as shown in FIG. 14. In this state, if wet etching is performed as will be described later, there is a concern that the sidewall portion De of the device layer D may be damaged. Thus, in the process A6, the protective film P1 is formed to protect at least the sidewall portion De of the device layer D. The protective film P1 is made of a material having tolerance against the chemical liquid used in the wet etching.

Figure 15:
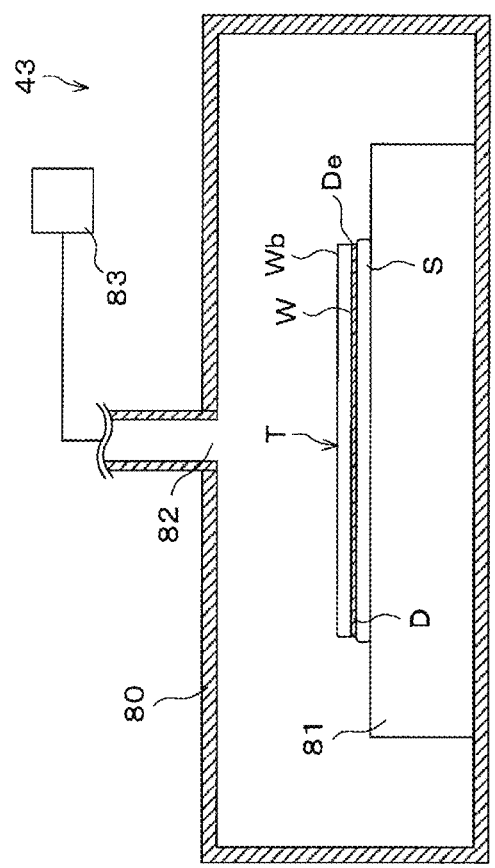
FIG. 15 is a side view illustrating a schematic configuration of the protective film forming apparatus.

In the protective film forming apparatus 43, the protective film P1 is formed by supplying, for example, the protective material in the gas state. As depicted in FIG. 15, for example, the protective film forming apparatus 43 is equipped with a processing vessel 80 configured to accommodate the combined wafer T therein. A placing table 81 is provided on a bottom surface of the processing vessel 80. The combined wafer T is placed on a top surface of the placing table 81 with the rear surface Wb of the processing target wafer W facing upwards. Further, a gas supply port 82 for supplying, to the combined wafer T placed within the processing vessel 80, the protective material in the gas state (hereinafter, referred to as a "protective material gas") for forming the protective film P1 is formed at a ceiling surface of the processing vessel 80. The gas supply port 82 communicates with a protective material gas source 83 which stores the protective material gas therein and supplies it into the processing vessel 80.

In the protective film forming apparatus 43, the protective material gas is supplied onto the entire surface of the combined wafer T placed on the placing table 81, that is, the rear surface Wb and a sidewall portion (including the sidewall portion De of the device layer D) of the combined wafer T exposed by the edge trimming. As a result, the protective film P1 is formed on the entire rear surface Wb and sidewall portions of the processing target wafer W, the device layer D and the oxide film Fw.

Further, in the process A6, since the protective film P1 is formed on the entire surface of the combined wafer T by the protective material gas as stated above, it is desirable that the formation of the protective film P1 by the protective material gas is performed prior to the grinding of the rear surface Wb in a process A8 to be described later. Thus, the protective film P1 can be appropriately formed on the sidewall portion De of the device layer D. Furthermore, in the protective film forming apparatus 43, the protective film P1 can be formed uniformly along the entire circumference of the sidewall portion De.

In addition, the way how to form the protective film P1 is not limited to the present exemplary embodiment. By way of example, the protective film P1 may be formed by spin coating. In this case, a protective material in a liquid state is supplied from a nozzle (not shown) placed above a center of the rear surface Wb while holding and rotating the processing target wafer W on a chuck (not shown). The protective material supplied onto the center of the rear surface Wb is diffused on the rear surface Wb to reach the sidewall portions of the processing target wafer W, the device layer D and the oxide film Fw. As a result, the protective film P1 is formed on the entire rear surface Wb and the sidewall portions of the processing target wafer W, the device layer D and the oxide film Fw. Further, since the protective film P1 aims at protecting the sidewall portion De of the device layer D, the protective film P1 may be formed only on the sidewall portion De of the device layer D. Moreover, a resin may be coated to cover the sidewall portion De, instead of the protective material. By way of non-limiting example, a UV-hardening resin or a fluorine-based resin may be used as such a resin. The sidewall portion De can still be protected by this resin.

Figure 6F:
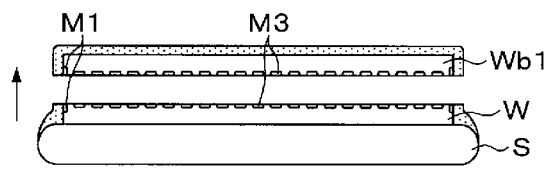

Subsequently, the combined wafer T is transferred into the separating apparatus 44 by the wafer transfer device 32. In the separating apparatus 44, a portion (hereinafter, referred to as "rear surface wafer Wb1") of the processing target wafer W at the rear surface Wb side is separated, starting from the internal modification layer M3, as shown in FIG. 6F (process A7 of FIG. 5).

Figure 16A:
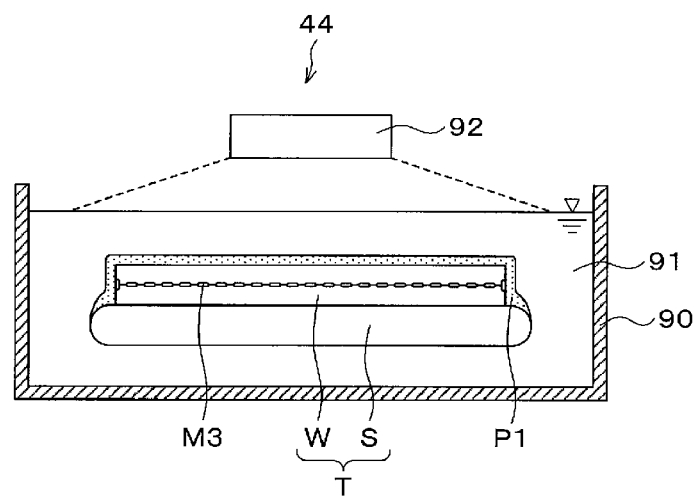
FIG. 16A to FIG. 16C are explanatory diagrams illustrating separation of a rear surface wafer from the processing target wafer in a separating apparatus.
Figure 16B:
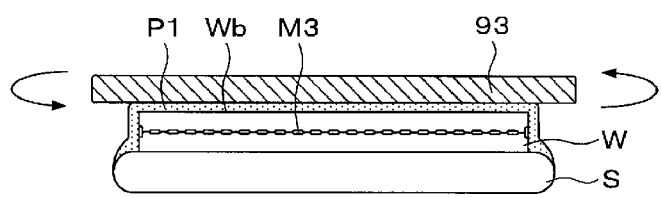
Figure 16C:
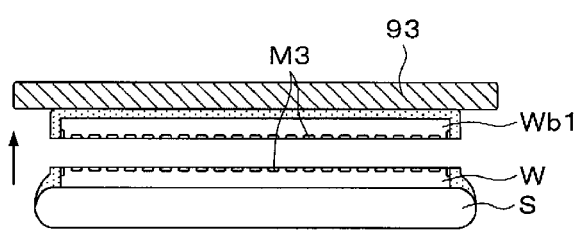

In the separating apparatus 44, the combined wafer T is immersed in pure water 91 stored in a pure water tub 90, as shown in FIG. 16A, for example. Then, an ultrasonic wave is emitted to the combined wafer T in the pure water 91 from an ultrasonic oscillator 92. Thereafter, an ultrasonic processing is performed on the processing target wafer W, and the rear surface Wb1 becomes easily removable, starting from the internal modification layer M3. Subsequently, the combined wafer T is taken out of the pure water tub 90, and the rear surface Wb of the processing target wafer W, more specifically, the protective film P1 is attracted to and held by an attraction pad 93, as illustrated in FIG. 16B. The attraction pad 93 is configured to be movable up and down in the vertical direction and pivotable. By rotating the attraction pad 93, the rear surface wafer Wb1 is separated with the internal modification layer M3 as a boundary. Thereafter, as illustrated in FIG. 16C, the attraction pad 93 is raised in the state that the rear surface wafer Wb1 is attracted to and held by the attraction pad 93, so that the rear surface wafer Wb1 is separated from the processing target wafer W.

Further, the way how to separate the rear surface wafer Wb1 is not limited to the present exemplary embodiment. By way of example, a tape (not shown) may be used instead of the attraction pad 93, and the rear surface wafer Wb1 may be separated by being held with this tape. Furthermore, if the rear surface wafer Wb1 can be separated only through the ultrasonic processing shown in FIG. 16A, for example, the separation using the attraction pad 93 or the tape may be omitted. Alternatively, by generating a temperature difference between the front surface Wa and the rear surface Wb of the processing target wafer W, the processing target wafer W may be distorted, thus allowing the rear surface wafer Wb1 to be separated.

Figure 6G:
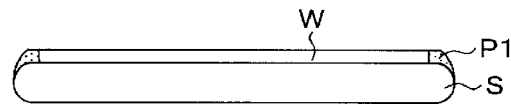

Afterwards, the combined wafer T is transferred into the grinding apparatus 46 by the wafer transfer device 32. In the grinding apparatus 46, the rear surface Wb (damaged surface) of the processing target wafer W is ground, and the internal modification layer M3 and the edge modification layer M1 left within the rear surface Wb are removed, as illustrated in FIG. 6G (process A8 of FIG. 5). To elaborate, the rear surface Wb is ground by rotating the processing target wafer W and the grinding whetstone in the state that the griding whetstone is in contact with the rear surface Wb and by lowering the grinding whetstone. Further, after the rear surface Wb is ground in the process A8, the rear surface Wb may be cleaned before wet etching of process A9 is conducted. By way of example, a brush or a compressed cleaning liquid may be used for the cleaning of the rear surface Wb.

Then, the combined wafer T is transferred into the wet etching apparatus 42 by the wafer transfer device 32. In the wet etching apparatus 42, the wet etching is carried out by supplying a chemical liquid onto the rear surface Wb (damaged surface) of the processing target wafer W (process A9 of FIG. 5). The rear surface Wb ground by the aforementioned grinding apparatus 46 may have a grinding trace thereon. In the process A9, this grinding trace thereon can be removed by the wet etching, so that the rear surface Wb can be smoothened.

In the present exemplary embodiment, the grinding of the rear surface Wb in the process A8 and the wet etching of the rear surface Wb in the process A9 constitute a processing for the corresponding rear surface Wb (damaged surface).

Figure 6H:
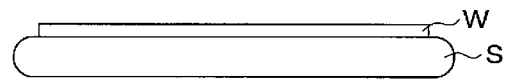

Subsequently, the combined wafer T is transferred into the protective film removing apparatus 45 by the wafer transfer device 32. In the protective film removing apparatus 45, the protective film P1 left on the combined wafer T is eliminated, as illustrated in FIG. 6H (process A10 of FIG. 5). Specifically, by supplying an organic solvent onto the protective film P1, the protective film P1 is removed. Further, if the protective film P1 left on the combined wafer T does not affect subsequent processes, the removal of the protective film P1 in the process A10 can be omitted.

Then, the combined wafer T after being subjected to all the required processings is transferred into the transition device 34 by the wafer transfer device 32, and then transferred into the cassette Ct on the cassette placing table 10 by the wafer transfer device 22. Accordingly, the series of processes of the wafer processing in the wafer processing system 1 are completed.

According to the above-described first exemplary embodiment, after the internal modification layer M3 is formed within the processing target wafer W in the process A5, the rear surface wafer Wb1 is separated in the process A7, starting from the internal modification layer M3. As described in Patent Document 1, for example, when the rear surface Wb of the processing target wafer W is ground, the grinding whetstone is abraded, and the disposal of the waste liquid is required as the grinding water is used. In the present exemplary embodiment, however, the laser head 53 itself is not degraded with a lapse of time. Thus, since a consumable is reduced, a frequency of maintenance can be reduced. Further, since a dry process is performed by using the laser, the usage of the grinding water and the disposal of the waste liquid are not required. Therefore, a running cost can be reduced. Furthermore, since it does not happen that the grinding water reaches the support wafer S, contamination of the support wafer S can be suppressed.

Moreover, in the present exemplary embodiment, though the grinding of the rear surface Wb (damaged surface) is performed in the process A8, this grinding only needs to be performed to the extent that the internal modification layer M3 and the edge modification layer M1 are removed. A grinding amount thereof is very small, for example, only several tens of micrometers. In contrast, if the rear surface Wb is ground to thin the processing target wafer W as in the prior art, a grinding amount may be large, for example, equal to or larger than 700 μm. As a result, the degree of abrasion of the grinding whetstone may be high. In the present exemplary embodiment as stated above, however, the frequency of maintenance can be reduced.

In addition, according to the present exemplary embodiment, when performing the edge trimming, the edge modification layer M1 is formed within the processing target wafer W in the process A2, and the edge portion We is then removed in the process A4, starting from the edge modification layer M1. In the method described in Patent Document 1, for example, since the edge portion We is ground or cut, the grinding whetstone is abraded and thus needs to be replaced regularly. In the present exemplary embodiment, on the other hand, since the laser head 53 itself is not degraded with a lapse of time, the frequency of maintenance can be reduced.

Here, however, it should be noted that the present disclosure does not exclude the edge trimming by the grinding. This is the same in a second exemplary embodiment and a third exemplary embodiment to be described later.

Further, according to the present exemplary embodiment, since the split modification layer M2 is formed in the process A3, the edge portion We to be removed in the process A4 can be broken into small pieces. Thus, the edge trimming can be carried out more easily.

Besides, the formation of the edge modification layer M1 in the process A2, the formation of the split modification layer M2 in the process A3 and the formation of the internal modification layer M3 in the process A5 can be performed in the one and the same modifying apparatus 40. Therefore, an equipment cost can be reduced. Here, however, the formation of the edge modification layer M1, the formation of the split modification layer M2 and the formation of the internal modification layer M3 can be performed by separate apparatuses.

Further, according to the present exemplary embodiment, since the non-bonding region Ae is formed in the process A1, the removing of the edge portion We in the process A4 can be carried out more effectively. As a consequence, the edge trimming can be performed more easily.

Figure 17:
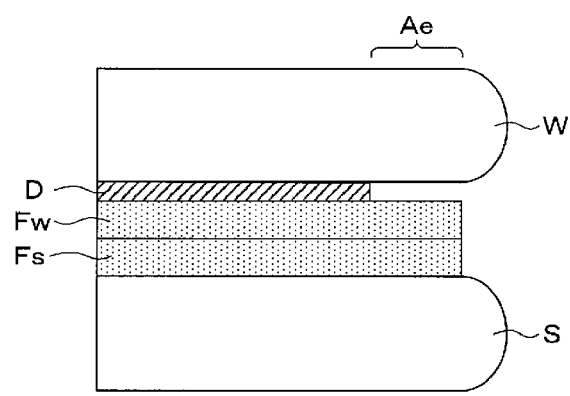
FIG. 17 is an explanatory diagram illustrating another example of formation of a non-bonding region.
Figure 18:
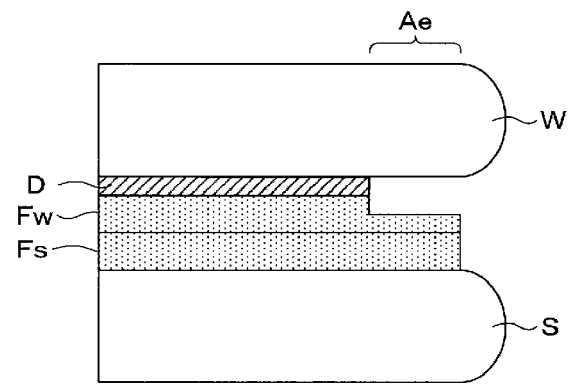
FIG. 18 is an explanatory diagram illustrating yet another example of formation of a non-bonding region.

Moreover, in the example shown in FIG. 7, the non-bonding region Ae is formed by modifying a part (a part in a thickness direction) of the device layer D as the interface with the processing target wafer W. However, the position where the non-bonding region Ae is formed is not limited thereto. By way of example, the non-bonding region Ae may be formed by removing the entire device layer D at the portion corresponding to the edge portion We, as depicted in FIG. 17, or may be formed by removing the device layer D and the oxide film Fw formed thereon at the portion corresponding to the edge portion We, as depicted in FIG. 18.

Figures 19A, 19B:
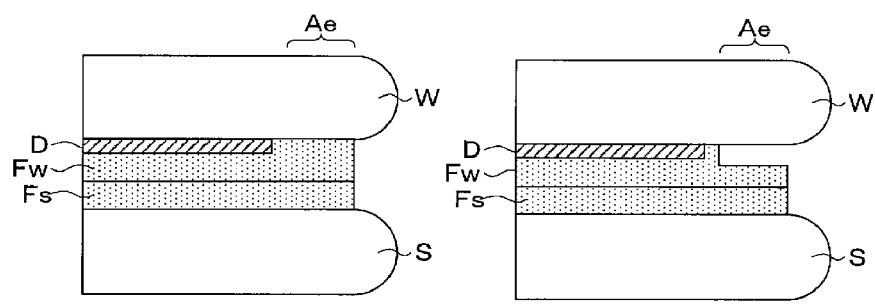
FIG. 19A and FIG. 19B are explanatory diagrams illustrating still yet another example of formation of a non-bonding region.

Additionally, as depicted in FIG. 19A, if the device layer D is not formed up to the edge portion We of the processing target wafer W and the oxide film Fw is formed to coat an end portion of the device layer D, the non-bonding region Ae may be formed by modifying a part of the oxide film Fw serving as an interface with the front surface Wa. It is also possible to form the non-bonding region Ae by removing the entire oxide film Fw at the portion corresponding to the edge portion We.

Besides, the formation of the non-bonding region Ae upon the processing target wafer W may be performed in the modifying apparatus 40 serving as the third modifying apparatus as mentioned above, or an interface modifying apparatus (not show) serving as the third modifying apparatus for forming the non-bonding region Ae may be further provided in the wafer processing system 1.

Figure 20:
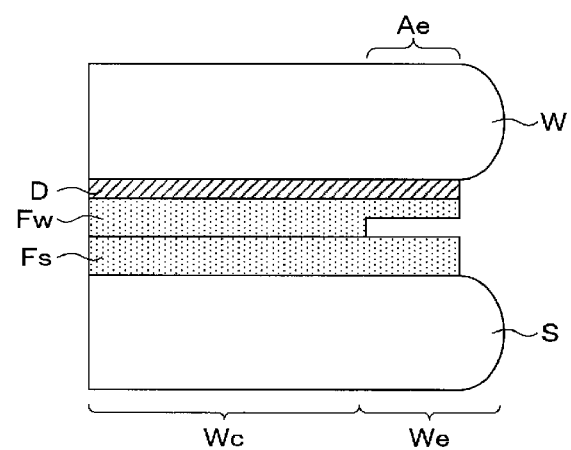
FIG. 20 is an explanatory diagram illustrating an example of formation of a non-bonding region before a bonding processing.

Furthermore, according to the present exemplary embodiment, the non-bonding region Ae is formed by radiating the laser light after the processing target wafer W is bonded, that is, by radiating the laser light to the combined layer T. However, the non-bonding region Ae may be formed before the processing target wafer W is bonded. To elaborate, the non-bonding region Ae is formed by modifying the oxide film Fw at the portion corresponding to the edge portion We of the processing target wafer W before being bonded, and by bonding the processing target wafer W having the non-bonding region Ae and the support wafer S, a combined wafer T as shown in FIG. 20 is formed.

When forming the non-bonding region Ae prior to the bonding of the processing target wafer W, the way how to form the non-bonding region Ae is not limited to modifying (roughening/removing) a bonding interface by the radiation of the laser light. By way of example, the non-bonding region Ae can be formed by removing the bonding interface through grinding or wet etching upon the processing target wafer W before being bonded, hydrophobization of the bonding interface, or the like. Furthermore, in the present exemplary embodiment, the roughening, the removing, the grinding and the hydrophobization of the bonding interface is generically called "modification." Further, the "bonding interface" in which the non-bonding region Ae is formed is not limited to the oxide film Fw shown in FIG. 20, and is referred to a portion at the processing target wafer W where an interface bonded to the support wafer S is formed.

Further, according to the present exemplary embodiment, since the internal modification layer M3 and the edge modification layer M1 are removed by grinding the rear surface Wb (damaged surface) in the process A8, a yield of the processing target wafer W as a product can be improved. Besides, since the protective film P1 is formed in the process A6 prior to the wet etching of the rear surface Wb (damaged layer) in the process A9, the device layer D can be protected. Therefore, the yield can be further improved.

Moreover, in the first exemplary embodiment, a processing sequence of the processes A1 to A10 can be changed.

As a first modification example, a sequence of the removing of the edge portion We in the process A4 and the formation of the internal modification layer M3 in the process A5 can be reversed. In this case, the wafer processing is performed in the order of A1 to A3, A5, A4, and A6 to A10.

As a second modification example, the formation of the internal modification layer M3 of the process A5 may be performed prior to the formation of the edge modification layer M1 of the process A2. In this case, the wafer processing is performed in the order of A5, A1 to A4, and A6 to A10.

As a third modification example, a sequence of the formation of the protective film Pa of the process A6 and the separation of the rear surface wafer Wb1 of the process A7 may be reversed. In this case, the wafer processing is performed in the order of A1 to A5, A7, A6, and A8 to A10.

As a fourth modification example, the first and third modification examples may be combined. That is, the wafer processing may be performed in the order of A1 to A3, A5, A4, A7, A6, and A8 to A10.

As a fifth modification example, the second and third modification examples may be combined. That is, the wafer processing may be performed in the order of A5, A1 to A4, A7, A6, and A8 to A10.

As a sixth modification example, the formation of the non-bonding region Ae of the process A1 may be performed after the formation of the edge modification layer M1 of the process A2. In this case, the wafer processing is performed in the order of A2, A1, A3, and A4 to A10.

Besides these modification examples, the wafer processing can be performed according to any of various other processing sequences.

Figure 21:
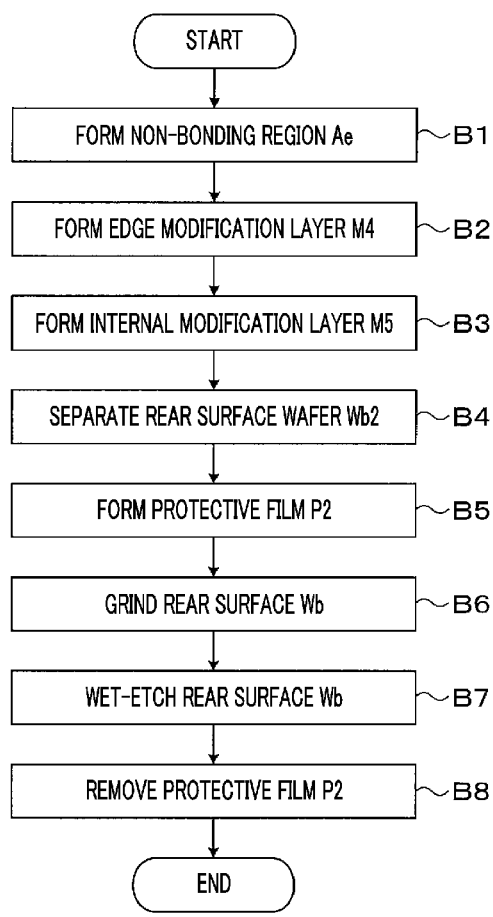
FIG. 21 is a flowchart illustrating major processes of a wafer processing according to a second exemplary embodiment.

Now, a wafer processing according to the second exemplary embodiment, which is performed by using the wafer processing system 1, will be explained. FIG. 21 is a flowchart showing major processes of the wafer processing. Further, in the second exemplary embodiment, detailed description upon the same processing as described in the first exemplary embodiment will be omitted.

Figure 22A:
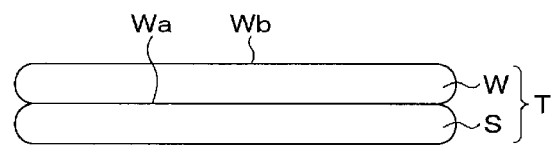
FIG. 22A to FIG. 22G are explanatory diagrams illustrating the major processes of the wafer processing according to the second exemplary embodiment.

First, as shown in FIG. 22A, a cassette Ct having therein a multiple number of combined wafers T is placed on the cassette placing table 10 of the carry-in/out station 2.

Then, the combined wafer T is taken out of the cassette Ct by the wafer transfer device 22, and transferred into the transition device 34. Subsequently, the combined wafer T is taken out of the transition device 34 by the wafer transfer device 32, and transferred into the modifying apparatus 40. In the modifying apparatus 40, a non-bonding region Ae is first formed at an interface of a processing target wafer W and a device layer D at a portion corresponding to an edge portion We (process B1 of FIG. 21). Here, the way how to form the non-bonding region Ae is the same as the way how to form the non-bonding region Ae in the above-described process A1.

Figure 22B:
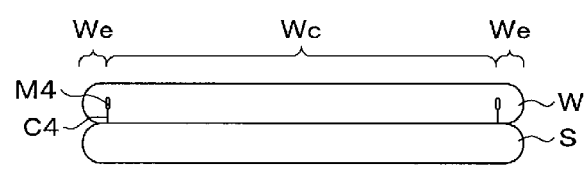

Subsequently, in the modifying apparatus 40, an edge modification layer M4 is formed within the processing target wafer W (process B2 of FIG. 21), as illustrated in FIG. 22B.

Figure 23:
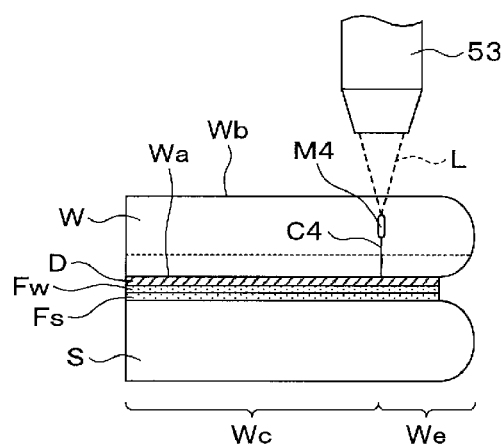
FIG. 23 is a longitudinal cross sectional view illustrating formation of an internal modification layer in a processing target wafer in the modifying apparatus.

In the modifying apparatus 40, the laser head 53 is moved to a position above a boundary between an edge portion We and a central portion Wc of the processing target wafer W, as shown in FIG. 23. Thereafter, by radiating laser light L from the laser head 53 to an inside of the processing target wafer W while rotating the chuck 50 by the rotating mechanism 52, the edge modification layer M4 is formed to have an annular shape along the boundary between the edge portion We and the central portion Wc.

Like the edge modification layer M1 in the first exemplary embodiment, the edge modification layer M4 is elongated in a thickness direction, and a lower end of this edge modification layer M4 is located above a target surface (indicated by a dashed line in FIG. 23) of the processing target wafer W after being ground. Further, the edge modification layer M4 is formed at the same height as an internal modification layer M5 to be described later.

Here, however, as compared to the edge modification layer M1 of the first exemplary embodiment in which the crack C1 develops up to a front surface Wa and a rear surface Wb of the processing target wafer W, a crack C4 from the edge modification layer M4 advances only to the front surface Wa and does not reach the rear surface Wb.

Figure 22C:
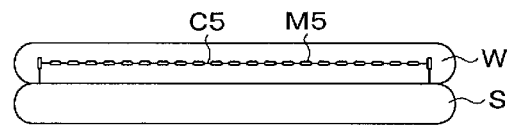

Subsequently, in the modifying apparatus 40, the internal modification layer M5 is formed within the processing target wafer W, as depicted in FIG. 22C (process B3 of FIG. 21). The same as the internal modification layer M3 of the first exemplary embodiment, the internal modification layer M5 is elongated in a plane direction of the processing target wafer W. Further, the internal modification layer M5 is formed at the same height as the edge modification layer M4, and a lower end of the internal modification layer M5 is located above the target surface of the processing target wafer W after being ground. The internal modification layer M5 may be plural in number, and these multiple modification layers M5 may be arranged in the plane direction. The multiple modification layers M5 may be formed in a range from a center to the edge modification layer M4 in the plane direction, that is, in the central portion Wc. Further, the way how to form the internal modification layer M5 is the same as the way how to form the internal modification layer M3 in the above-described process A5. Furthermore, a crack C5 develops from the internal modification layer M5 in the plane direction. In addition, if a pitch of the internal modification layer M5 is small, no crack C5 may be formed.

Figure 22D:
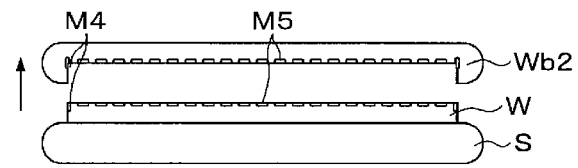

Subsequently, the combined wafer T is transferred into the separating apparatus 44 by the wafer transfer device 32. In the separating apparatus 44, a portion (hereinafter, referred to as "rear surface wafer Wb2") of the processing target wafer W at the rear surface Wb side is separated, starting from the internal modification layer M5 and the edge modification layer M4, as shown in FIG. 22D (process B4 of FIG. 21). At this time, since the internal modification layer M5 and the edge modification layer M4 are formed at the same height, the rear surface wafer Wb2 is separated as one body with the edge portion We. Further, the way how to separate the rear surface wafer Wb2 is the same as the way how to separate the rear surface wafer Wb1 in the above-described process A7.

Moreover, in removing of the edge portion We, since the non-bonding region Ae is formed at an interface between the processing target wafer W and a support wafer S at the portion corresponding to the edge portion We, the edge portion We can be peeled off easily, so that the separation of the rear surface wafer Wb2 can be carried out appropriately.

Figure 22E:
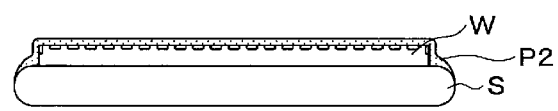

Subsequently, the combined wafer T is transferred into the protective film forming apparatus 43 by the wafer transfer device 32. In the protective film forming apparatus 43, a protective film P2 is formed on the processing target wafer W, as depicted in FIG. 22E (process B5 of FIG. 21). The protective film P2 is formed on the entire rear surface Wb, and sidewall portions of the processing target wafer W, a device layer D and an oxide film Fw. Further, a method of forming the protective film P2 is the same as the method of forming the protective film P1 in the above-described process A6.

Figure 22F:
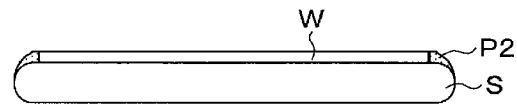

Thereafter, the combined wafer T is transferred into the grinding apparatus 46 by the wafer transfer device 32. In the grinding apparatus 46, by grinding the rear surface Wb (damaged surface) of the processing target wafer W, the internal modification layer M5 and the edge modification layer M4 left in the rear surface Wb are removed (process B6 of FIG. 21), as shown in FIG. 22F. Further, the way how to grind the rear surface Wb is the same as the way how to grind the rear surface Wb in the above-described process A8.

Afterwards, the combined wafer T is transferred into the wet etching apparatus 42 by the wafer transfer device 32. In the wet etching apparatus 42, by supplying a chemical liquid onto the rear surface Wb (damaged surface) of the processing target wafer W, the corresponding rear surface Wb is wet-etched (process B7 of FIG. 21). Further, the way how to wet-etch the rear surface Wb is the same as the way how to wet-etch the rear surface Wb in the above-described process A9.

Figure 22G:
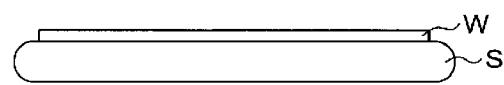

Then, the combined wafer T is transferred into the protective film removing apparatus 45 by the wafer transfer device 32. In the protective film removing apparatus 45, the protective film P2 left on the combined wafer T is removed, as illustrated in FIG. 22G (process B8 of FIG. 21). Further, the way how to remove the protective film P2 is the same as the way how to remove the protective film P1 in the above-described process A10.

Thereafter, the combined wafer T after being subjected to the all the required processings is transferred into the transition device 34 by the wafer transfer device 32, and then transferred into the cassette Ct on the cassette placing table 10 by the wafer transfer device 22. Accordingly, the series of processes of the wafer processing in the wafer processing system 1 are completed.

In the above-described second exemplary embodiment, the same effects obtained as in the first exemplary embodiment can be achieved. Besides, in the second exemplary embodiment, since a diameter of the rear surface wafer Wb2 is not different from a diameter of the processing target wafer W before being processed, the rear surface wafer Wb2 can be reused. In this case, a collector configured to collect the separated rear surface wafer Wb2 and a cleaning unit configured to clean the rear surface wafer Wb2 may be provided in the wafer processing system 1. Further, in addition to the collecting and cleaning of the rear surface wafer Wb2, this rear surface wafer Wb2 may be ground, and, in such a case, the wafer processing system 1 may be equipped with a grinding unit. Further, the rear surface wafer Wb2 may be wet-etched, and, in such a case, the wafer processing system 1 may be equipped with a wet etching unit.

In addition, in the second exemplary embodiment, a processing sequence of the processes B1 to B8 may be changed.

As a first modification example, the formation of the edge modification layer M4 in the process B2 and the formation of the internal modification layer M5 in the process B3 may be reversed. In this case, the wafer processing is performed in the order of B1, B3, B2, and B4 to B8.

As a second modification example, the formation of the non-bonding region Ae of the process B1 may be formed performed after the formation of the edge modification layer M4 of the process B2. In this case, the wafer processing may be performed in the order of B2, B1, and B3 to B8.

As a third modification example, the formation of the non-bonding region Ae in the process B1 may be performed after the formation of the internal modification layer M5 of the process B3. In this case, the wafer processing may be formed in the order of B2 and B3, B1, and B4 to B8.

Now, a wafer processing according to the third exemplary embodiment, which is performed by the wafer processing system 1, will be discussed. The third exemplary embodiment is substantially identical to the second exemplary embodiment except that an internal modification layer formed in a process B3 is different.

Figure 24A:
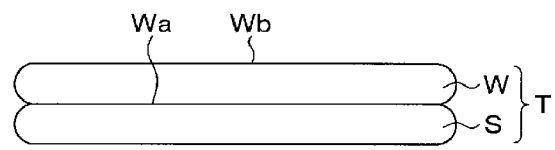
FIG. 24A to FIG. 24G are explanatory diagrams illustrating major processes of a wafer processing according to a third exemplary embodiment.
Figure 24B:
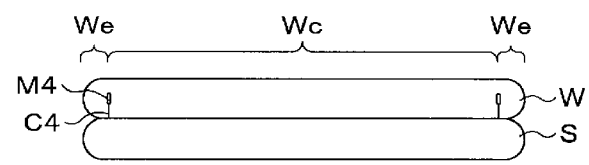
Figure 24C:
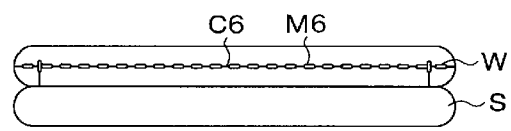

In the process B3, an internal modification layer M6 is formed within a processing target wafer W, as depicted in FIG. 24C. As compared to the internal modification layer M5 of the second exemplary embodiment elongated up to the edge modification layer M4, the internal modification layer M6 of the third exemplary embodiment may be elongated from a center of the processing target wafer W up to an outer edge thereof in a plane direction. Further, a crack C6 develops from the internal modification layer M6 in the plane direction. If a pitch of the internal modification layer M6 is small, no crack C6 may be formed.

Figure 24D:
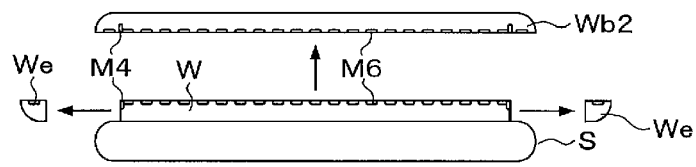
Figure 24E:
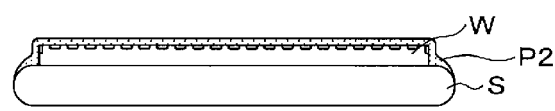
Figure 24F:
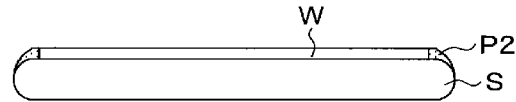
Figure 24G:
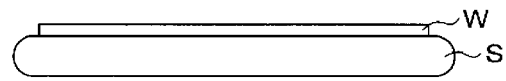

In such a case, in a process B4, a rear surface wafer Wb2 above the internal modification layer M6 and an edge portion We under the internal modification layer M6 are separated individually, as depicted in FIG. 24D. That is, the rear surface wafer Wb2 is separated starting from the internal modification layer M6, and the edge portion We is separated starting from the edge modification layer M4. The other processes B1 and B2 and B5 to B8 are the same as those of the second exemplary embodiment.

According to the above-described third exemplary embodiment, the same effects as obtained in the first and second exemplary embodiment can still be achieved.

In the above-described exemplary embodiments, the protective film P1 or P2 is formed as a protective layer for protecting the sidewall portion De of the device layer D, the protective layer is not limited thereto. By way of example, during the wet etching processing in the wet etching apparatus 42, an obstruction liquid may be supplied to the sidewall portion De lest a chemical liquid should be supplied to the sidewall portion De of the device layer D.

Further, in the modifying apparatus 40 according to the above-described exemplary embodiments, when forming the multiple internal modification layers M3, M5 or M6, the laser light from the single laser head 53 (light source) may be radiated while being split into multiple lights by, for example, a lens. Alternatively, laser lights may be radiated to the multiple points at the same time from multiple laser heads 35 (light sources).

In addition, in the wafer processing system 1 according to the above-described exemplary embodiments, the trimming may be performed to conform to a notch of the processing target wafer W.

Now, a configuration of a wafer processing system according to another exemplary embodiment will be described.

Figure 25:
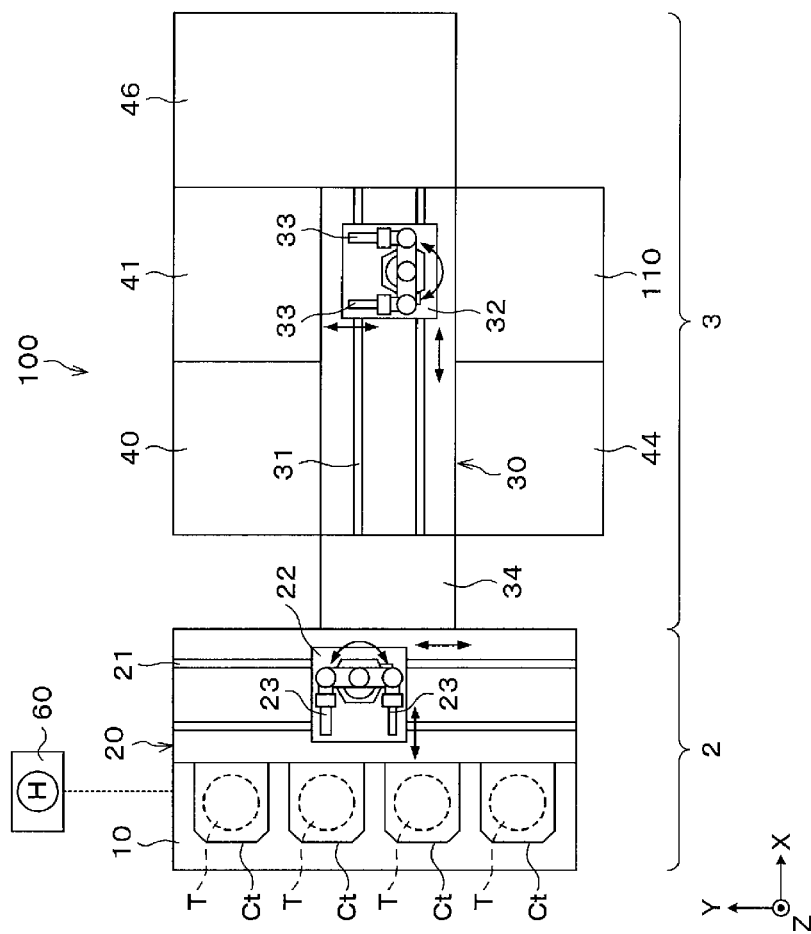
FIG. 25 is a plan view schematically illustrating a configuration of a wafer processing system according to another exemplary embodiment.

As depicted in FIG. 25, a wafer processing system 100 is equipped with, instead of the wet etching apparatus 42, a CMP (Chemical Mechanical Polishing) apparatus 110. This CMP apparatus 110 serves as a damage processing apparatus, the same as the wet etching apparatus 42. That is, in the CMP apparatus 110, a rear surface Wb (damaged surface) ground by a grinding apparatus 46 is polished. By removing a grinding trace formed on the rear surface Wb by the grinding apparatus 46, CMP apparatus 110 smoothens the corresponding rear surface Wb.

Further, in the wafer processing system 100, a wet etching processing in the wet etching apparatus 42 is not performed, a sidewall portion De of a device layer D need not be protected from a chemical liquid. Therefore, the protective film forming apparatus 43 and the protective film removing apparatus 45 can be omitted.

Moreover, in the grinding apparatus 46 as the damage processing apparatus as described above, an internal modification layer and an edge modification layer are removed by grinding the rear surface Wb. Here, however, if the internal modification layer and the edge modification layer can be removed only with the wet etching apparatus 42 or the CMP apparatus 110, the grinding apparatus 46 may be omitted. In addition, a processing of the rear surface Wb (damaged surface) may be performed only with the grinding apparatus 46. In such a case, the wet etching apparatus 42 or the CMP apparatus 110 may be omitted.

Besides, in the wafer processing system 1 (100), the bonding of the processing target wafer W and the support wafer S is performed by the external bonding apparatus provided at the outside of the wafer processing system 1 (100). This bonding apparatus, however, may be provided within the wafer processing system 1 (100). In such a case, cassettes Ct respectively capable of accommodating therein a multiple number of processing target wafers W, a multiple number of support wafers S, and a multiple number of combined wafers T are carried into/from the carry-in/out station 2. The cassette placing table 10 is configured to place these cassettes Ct thereon in a row in the Y-axis direction.

Further, if the oxide films Fw and Fs at the edge portion We are also bonded when the processing target wafer W and the support wafer S are bonded to each other, a pre-processing may be performed on the oxide films Fw and Fw before the bonding of the processing target wafer W and the support wafer S is performed. As the pre-processing, a surface layer of the oxide film Fw at the edge portion We may be removed, or the oxide film Fw may be processed to be projected. Alternatively, a surface of the oxide film Fw may be roughened. By performing this pre-processing, bonding of the oxide films Fw and Fs at the edge portion We can be suppressed, so that the edge portion We can be removed appropriately.

In addition, a rear surface film (for example, an oxide film or a nitride film) may be formed on the rear surface Wb of the processing target wafer W which is an incident surface upon which the laser light for forming the internal modification layer and the edge modification layer is incident.

Further, this rear surface film may include a natural oxide film formed by exposure of the processing target wafer W to the air, a protective film formed to protect the rear surface Wb of the processing target wafer W, an adjustment film formed to adjust a distortion amount of the processing target wafer W, or the like. If this rear surface film is formed on the processing target wafer W as stated above, the laser light may be reflected or absorbed by the rear surface film, resulting in a failure to form the above-described internal modification layer and edge modification layer appropriately. Further, as a result of this failure, a processing height of the internal modification layer and the edge modification layer may not be controlled appropriately.

To solve the problems, the rear surface film of the processing target wafer W may be removed before the laser light is radiated to form the modification layer. This removing of the rear surface film may be carried out by any of various methods such as, but not limited to, wet etching and plasma etching.

In this way, by removing the rear surface film prior to the radiation of the laser light, that is, prior to the formation of the modification layer, the absorption or reflection of the laser light for use in forming the modification layer is suppressed, so that the internal modification layer and the edge modification layer can be appropriately formed at a required position and a required height. Thus, the separation of the rear surface wafer Wb1 (Wb2) and the removing of the edge portion We can be performed appropriately. Further, in case that the non-bonding region Ae is formed after the bonding of the processing target wafer W as mentioned above, absorption and reflection of the laser light for forming the non-bonding region Ae can be suppressed.

Moreover, the removing of the rear surface film may be performed by the wet etching apparatus 42 which also serves as a rear surface film removing apparatus, or an additional rear surface film removing apparatus (not shown) may be provided in the wafer processing system 1.

The above exemplary embodiments have been described for the case where the processing target wafer W and the support wafer S are directly bonded to each other. However, the processing target wafer W and the support wafer S may be bonded with an adhesive therebetween.

It should be noted that the above-described exemplary embodiments are illustrative in all aspects and are not anyway limiting. The above-described exemplary embodiments may be omitted, replaced and modified in various ways without departing from the scope and the spirit of claims.

EXPLANATION OF CODES

According to the exemplary embodiments, it is possible to thin one substrate efficiently in a combined substrate composed of multiple substrates bonded to each other.

We claim:

1. A substrate processing system configured to process a substrate, comprising:
    a first modifying apparatus configured to form, within a combined substrate, an internal modification layer by radiating laser light, wherein the combined substrate is formed by bonding a front surface of a first substrate and a front surface of a second substrate with a device layer therebetween, and the internal modification layer is elongated within the first substrate in a plane direction from a center of the first substrate toward at least an edge portion of the first substrate as a removing target;
    a second modifying apparatus configured to form, within the first substrate, an edge modification layer by radiating laser light, wherein the edge modification layer is elongated in a thickness direction of the first substrate along a boundary between the edge portion and a central portion of the first substrate;
    a separating apparatus configured to separate a portion of the first substrate at a rear surface side, starting from the internal modification layer; and
    a third modifying apparatus configured to form a non-bonding region, which reduces a bonding force between the first substrate and the second substrate, by radiating laser light at an interface between the first substrate and the second substrate.

2. The substrate processing system of claim 1,
    wherein the third modifying apparatus is configured to form the non-bonding region at a portion corresponding to the edge portion.

3. The substrate processing system of claim 1,
    wherein the second modifying apparatus forms the edge modification layer such that a crack formed in the thickness direction of the first substrate from the edge modification layer develops up to the front surface and a rear surface of the first substrate.

4. The substrate processing system of claim 3, further comprising:
    an edge removing apparatus configured to remove the edge portion starting from the edge modification layer.

5. The substrate processing system of claim 1,
    wherein the second modifying apparatus forms a split modification layer elongated within the first substrate outwards from the edge modification layer in a diametrical direction.

6. The substrate processing system of claim 1,
    wherein the first modifying apparatus forms the internal modification layer such that the internal modification layer is elongated within the first substrate in the plane direction from the center thereof up to the edge modification layer, and
    the second modifying apparatus forms the edge modification layer such that a crack formed in the thickness direction of the first substrate from the edge modification layer develops up to the front surface of the first substrate.

7. The substrate processing system of claim 1,
    wherein the first modifying apparatus forms the internal modification layer such that the internal modification layer is elongated within the first substrate in the plane direction from the center of the first substrate toward an outer edge thereof, and
    the second modifying apparatus forms the edge modification layer such that a crack formed in the thickness direction of the first substrate from the edge modification layer develops up to the front surface of the first substrate.

8. The substrate processing system of claim 1,
    wherein the first modifying apparatus and the second modifying apparatus are a same apparatus.

9. The substrate processing system of claim 1, further comprising:
    a damage processing apparatus configured to process a damaged surface in which the internal modification layer is formed in the first substrate after being separated by the separating apparatus.

10. The substrate processing system of claim 9, further comprising:

a protective layer forming apparatus configured to form a protective layer configured to protect a device layer formed on the front surface of the first substrate, wherein the damage processing apparatus performs wet etching on the damaged surface, and the protective layer forming apparatus forms the protective layer to protect at least a sidewall portion of the device layer exposed by removing the edge portion of the first substrate.

11. The substrate processing system of claim 10, further comprising:

a protective layer removing apparatus configured to remove the protective layer.

12. The substrate processing system of claim 1, further comprising:

a rear surface film removing apparatus configured to remove a rear surface film formed on a rear surface of the first substrate before forming modification layers in the first substrate.

13. A substrate processing method of processing a substrate, comprising:

forming, within a combined substrate, an internal modification layer by radiating laser light, wherein the combined substrate is formed by bonding a front surface of a first substrate and a front surface of a second substrate with a device layer therebetween, and the internal modification layer is elongated within the first substrate in a plane direction from a center of the first substrate toward at least an edge portion of the first substrate as a removing target;

forming, within the first substrate, an edge modification layer by radiating laser light, wherein the edge modification layer is elongated in a thickness direction of the first substrate along a boundary between the edge portion and a central portion of the first substrate;

separating a portion of the first substrate at a rear surface side, starting from the internal modification layer; and forming a non-bonding region, which reduces a bonding force between the first substrate and the second substrate, by radiating laser light at an interface between the first substrate and the second substrate.

14. The substrate processing method of claim 13, wherein the non-bonding region is formed at a portion corresponding to the edge portion.

15. The substrate processing method of claim 14, wherein the forming of the non-bonding region is performed before the first substrate and the second substrate are bonded.

16. The substrate processing method of claim 14, wherein the forming of the non-bonding region is performed after the first substrate and the second substrate are bonded.

17. The substrate processing method of claim 13, wherein in the forming of the edge modification layer, the edge modification layer is formed such that a crack formed in the thickness direction of the first substrate from the edge modification layer develops up to the front surface and a rear surface of the first substrate.

18. The substrate processing method of claim 17, further comprising:

removing the edge portion, starting from the edge modification layer.

19. The substrate processing method of claim 13, further comprising:

forming a split modification layer elongated within the first substrate outwards from the edge modification layer in a diametrical direction.

20. The substrate processing method of claim 13, wherein in the forming of the internal modification layer, the internal modification layer is formed such that the internal modification layer is elongated within the first substrate in the plane direction from the center thereof up to the edge modification layer, and in the forming of the edge modification layer, the edge modification layer is formed such that a crack formed in the thickness direction of the first substrate from the edge modification layer develops up to the front surface of the first substrate.

21. The substrate processing method of claim 13, wherein in the forming of the internal modification layer, the internal modification layer is formed such that the internal modification layer is elongated within the first substrate in the plane direction from the center of the first substrate toward an outer edge thereof, and in the forming of the edge modification layer, the edge modification layer is formed such that a crack formed in the thickness direction of the first substrate from the edge modification layer develops up to the front surface of the first substrate.

22. The substrate processing method of claim 13, further comprising:

processing a damaged surface in which the internal modification layer is formed in the first substrate after being separated.

23. The substrate processing method of claim 22, further comprising:

forming a protective layer configured to protect a device layer formed on the front surface of the first substrate, wherein in the processing of the damaged surface, wet etching is performed on the damaged surface, and in the forming of the protective layer, the protective layer is formed to protect at least a sidewall portion of the device layer exposed by removing the edge portion of the first substrate.

24. The substrate processing method of claim 23, further comprising:

removing the protective layer.

25. The substrate processing method of claim 13, further comprising:

removing a rear surface film formed on a rear surface of the first substrate, before forming modification layers in the first substrate.

* * * * *